United States Patent [19]

Minnaja

[11] Patent Number: 5,204,937
[45] Date of Patent: Apr. 20, 1993

[54] NEURAL DATA-PROCESSING NET WITH ELECTROCHROMIC MATERIAL REGIONS

[75] Inventor: Nicola Minnaja, Rome, Italy

[73] Assignee: Eniricerche S.p.A., Milan, Italy

[21] Appl. No.: 612,233

[22] Filed: Nov. 9, 1990

[30] Foreign Application Priority Data

Nov. 15, 1989 [IT] Italy ............................ 68006 A/89

[51] Int. Cl.⁵ .................... H01L 27/14; G02F 1/01
[52] U.S. Cl. .................................. 395/25; 364/807;
365/215
[58] Field of Search .................. 364/513, 807, 822;
346/160; 338/308; 357/2; 350/357; 395/25;
365/107, 215

[56] References Cited

U.S. PATENT DOCUMENTS

| | | | |
|---|---|---|---|
| 4,375,318 | 3/1983 | Giglia et al. | 350/357 |
| 4,375,319 | 3/1983 | Wada et al. | 350/357 |
| 4,392,209 | 7/1983 | DeBar | 365/215 |
| 4,488,781 | 12/1984 | Giglia | 350/357 |
| 4,498,156 | 2/1985 | Pizzarello | 365/107 |
| 4,681,403 | 7/1987 | Te Velde et al. | 350/357 |
| 4,760,437 | 7/1988 | Denker et al. | 364/513 |
| 4,916,470 | 4/1990 | Kovacs et al. | 346/160 |
| 4,931,763 | 6/1990 | Ramesham et al. | 338/308 |
| 4,943,556 | 7/1990 | Szu | 364/807 |
| 4,945,257 | 7/1990 | Marrocco, III | 364/807 |
| 4,969,021 | 11/1990 | Thakoor et al. | 357/2 |
| 5,010,512 | 4/1991 | Hartstein et al. | 364/513 |

FOREIGN PATENT DOCUMENTS

| | | | |
|---|---|---|---|
| 0127140 | 5/1984 | European Pat. Off. | |
| 01931 | 3/1986 | PCT Int'l Appl. | |
| 0529467 | 11/1976 | U.S.S.R. | 364/822 |

Primary Examiner—Allen R. MacDonald
Assistant Examiner—George Davis
Attorney, Agent, or Firm—Hedman, Gibson & Costigan

[57] ABSTRACT

The neural net includes a plurality of synaptic circuits associated with a matrix including:
- a plurality of line electrodes ($R_i$),
- a plurality of column electrodes ($C_j$), and
- a plurality of ordered regions ($A_{ij}$) in which line electrodes ($R_i$) and column electrodes ($C_j$) are interconnected.

At least some of the connecting regions ($A_{ij}$) include electrochromic material (ECM).

1 Claim, 3 Drawing Sheets

5,204,937

NEURAL DATA-PROCESSING NET WITH ELECTROCHROMIC MATERIAL REGIONS

FIELD OF THE INVENTION

The present invention relates to a neural net for data-processing and a method of data-processing which provides for the use of the neural net.

STATE OF THE PRIOR ART

Interest in neural nets based on neuron models has increased considerably in recent times.

Many factors have contributed to this: neurobiologists have started to improve their understanding of biological processing mechanisms, the availability of low-cost computational power has enabled detailed analysis of circuit models of biological systems and, finally, interest in parallel processing and analog VLSI (very large-scale integration), which in turn are suitable for embodiment in neuron-type circuits, has increased. These developments have been accompanied by the formulation of new neuron models.

According to J.J. Hopfield's model (see Proceedings of the National Academy of Science U.S.A., Vol.79, p. 2554, 1982) a neuron can be imitated by an adder element with a non-linear transfer characteristic whose inputs are "weighted" with coefficients characteristic of the net.

In a known circuit (see C. Mead, "Analog VLSI and Neural Systems", Addison-Wesley, 1989), the characteristic weighting coefficients of the net can be defined by the transconductance values of MOS transistors and these values can be defined in turn by the resistance values of resistors. A neural net is thus defined once the values of the weighting coefficients assigned to its inputs have been defined. A neural net for a new and different function, however, has to be constructed from scratch with transistors having correspondingly different transconductances.

A neural net which can be adapted to carry out different functions is described in U.S. Pat. No. 4,760,437. This known neural net includes a matrix comprising a plurality of line electrodes, a plurality of column electrodes, and a plurality of ordered regions in which line electrodes and column electrodes intersect. An element of photoconductive material is associated with each region of intersection and the electrical resistance of the element is determined by the intensity of light caused to fall thereon. The resistance of the element thus determined corresponds to the value of a weighting coefficient associated with the location in the matrix to which the element belongs.

A mask, such as a photographic plate, is therefore associated with a neuron matrix of this type, the mask having zones whose transparencies differ in dependence on the weighting coefficients to be assigned to the various locations in the matrix. The matrix is then illuminated through the mask by a uniform-light source and the matrix thus becomes "specialised" to carry out the desired function.

With a neural net according to the United States patent cited above, the mask by means of which the electrical resistances of the photosensitive elements of the matrix are defined has to be replaced in order to modify the function carried out by the net. Obviously, this kind of operation cannot be carried out continuously during processing. In other words, the neural net according to U.S. Pat. No. 4,760,437 does not have a so-called "leaning capability", that is, a capacity for the "on-line" alteration or up-dating of the weightings associated with at least some locations in the matrix.

DEFINITION OF THE INVENTION

The object of the present invention is to provide a neural net of the aforesaid type which is formed so as to have a learning capability.

According to the invention, this object is achieved, by means of a neural data-processing net including active electronic devices associated with a matrix comprising a plurality of line electrodes, a plurality of column electrodes, and a plurality of ordered regions in which line electrodes and column electrodes are interconnected, the neural net being characterised in that at least some of the connecting regions of the matrix include electrochromic material.

Electrochromic materials are materials which can be coloured reversibly as a result of the passage of an electrical load. Electrochromism is a phenomenon by which a reversible colour-change can be induced in some materials as a result of an electrochemical process. More precisely, electrochromism can be defined as a persistent but reversible electrochemically-induced optical change.

Electrochromic materials are therefore suitable for forming elements whose transparency can be changed reversibly by the passage of current pulses through the elements in one direction or the other according to whether their transparency is to be increased or reduced. This property of electrochromic materials enables neural nets with learning capabilities to be formed, as will become clearer from the following.

The invention also concerns a method of data-processing which provides for the use of a neural net of the type defined above.

BRIEF DESCRIPTION OF THE DRAWINGS

Further characteristics and advantages of the invention will become clear from the detailed description which follows with reference to the appended drawings, provided purely by way of non-limiting example, in which.

DETAILED DESCRIPTION OF THE INVENTION

With reference to the drawings, a neural data-processing net according to the invention includes a support substrate 1 of at least partially transparent material, for example glass.

Figure 1:
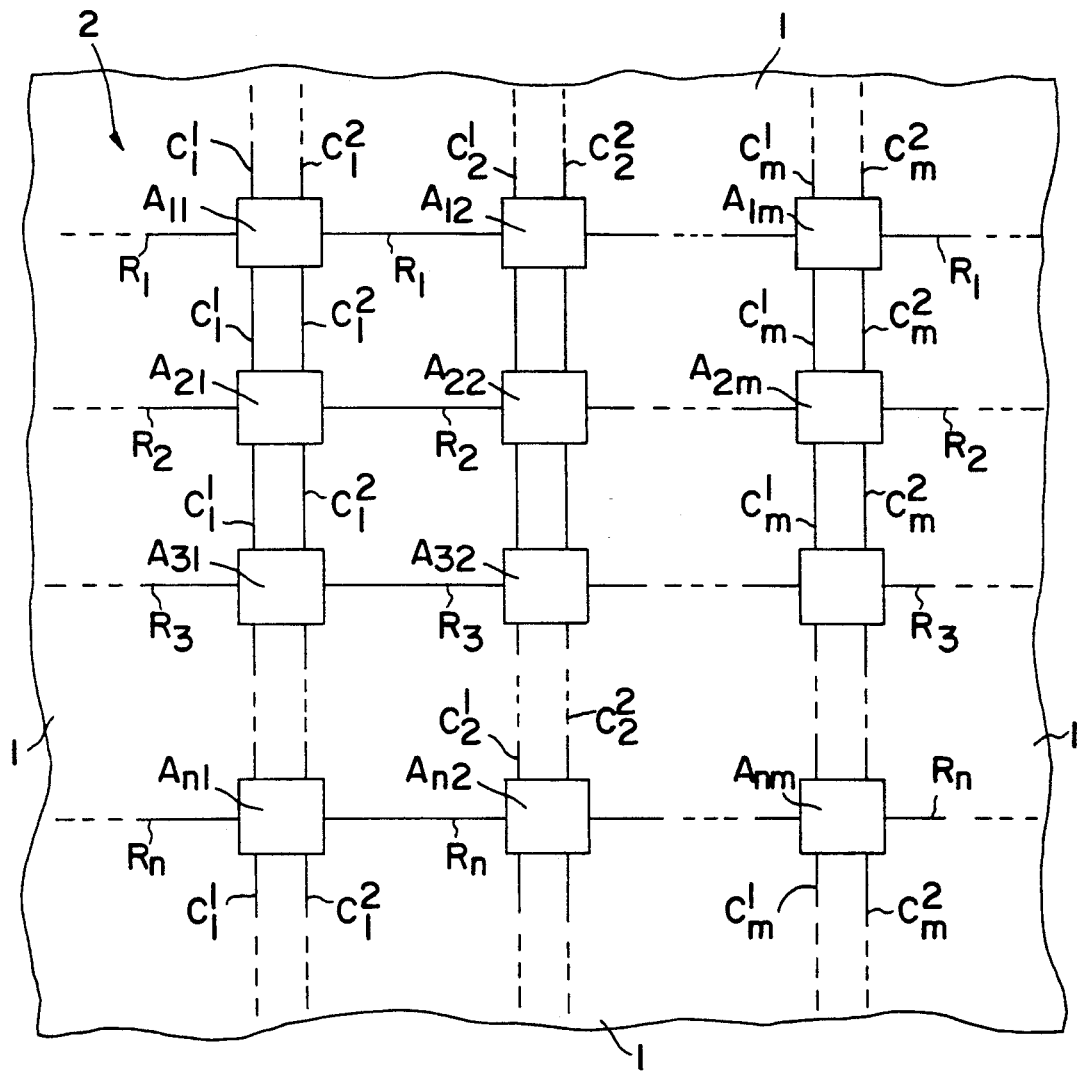
FIG. 1 is a diagram showing the structure of a neural net matrix according to the invention.

A matrix structure, generally indicated 2 in FIG. 1, is formed on one face of the substrate.

As will become clearer from the following, the neural net also includes active electronic devices which interact with the matrix 2 and conveniently are formed on the other face of the supporting substrate 1.

In the embodiment to which FIG. 1 relates, the matrix structure 2 comprises a plurality of line electrodes $R_i$ (i=1, 2 ... n) and a plurality of pairs of column electrodes $C^k_j$ (j=1, 2 ... m, m being equal to or different from n; k=1,2).

The matrix 2 of FIG. 1 also has a plurality of ordered connecting regions $A_{ij}$, each of which interconnects a pair of column electrodes and a line electrode.

Figure 2:
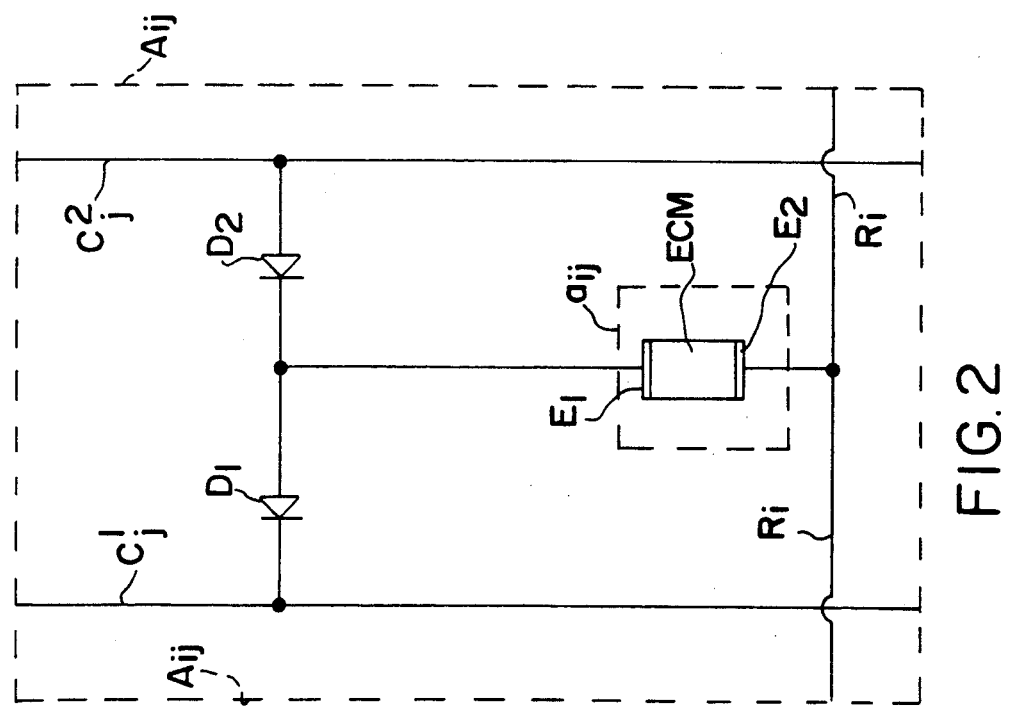
FIG. 2 shows the structure of the circuitry in a region line electrodes and column electrodes of the matrix of FIG. 1 are interconnected.

FIG. 2 is a symbolic circuit diagram of a generic connecting region $A_{ij}$: two diodes, indicated $D_1$ and $D_2$, are arranged in series between the column electrodes $C^1_j$ and $C^2_j$.

An element, indicated ECM, of electrochromic material, for example, tungsten oxide $WO_3$, is deposited on a small area of the region $A_{ij}$, indicated $a_{ij}$. This element has two electrodes $E_1$, $E_2$, the first of which is connected to the anode of $D_1$ and to the cathode of $D_2$, whilst the second is connected to the line electrode $R_i$.

The arrangement of the diodes $D_1$ and $D_2$ is such that an electric current can flow through ECM in one direction or the other. Thus, if the column electrodes $C^1_j$ and $C^2_j$ are connected to the positive pole of a direct-current voltage supply and the line electrode $R_i$ is connected to the negative pole (or to earth), a current flows through $C^2_j$, $D_2$, ECM, and the line electrode $R_i$.

If the column electrodes are connected to the negative pole of the supply and the line electrode $R_i$ is connected to the positive pole, however, a current will flow through $R_i$, ECM, $D_1$ and $C^1_j$, passing through ECM in the opposite direction from that described above.

As a result of the known properties of electrochromic materials (in this connection see, for example, the article "Electrochromism and Electrochromic Devices" by B. Scrosate, Chimicaoggi, June 1989, pp. 41–45) a pulse of current through ECM in one direction or the other has the effect of increasing or reducing (persistently but reversibly) the transparency of the electrochromic element.

Figure 3:
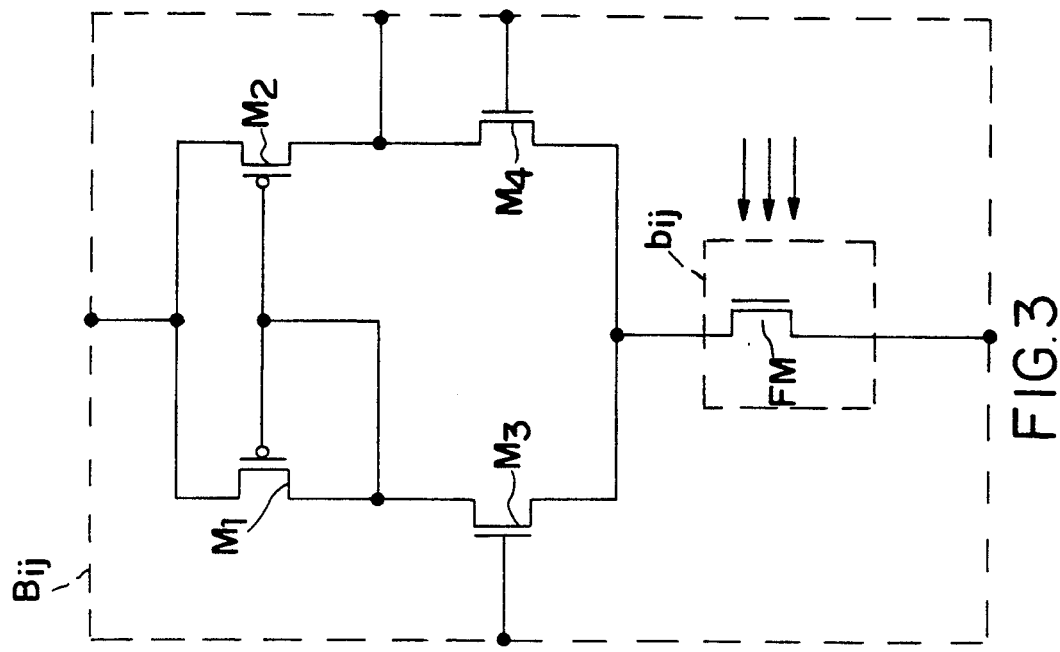
FIG. 3 shows, by way of example, a circuit diagram of a synapse associated with a region in which line electrodes and column electrodes of the matrix are interconnected.

Synaptic circuits are formed on the other face of the support substrate 1 in regions $B_{ij}$ (FIG. 3) situated in positions corresponding to the connecting regions $A_{ij}$ of the matrix 2, for example, according to the layout shown in FIG. 3. This layout provides for an analog differential amplifier comprising, in known manner, a pair of p-type MOS transistors, indicated $M_1$ and $M_2$, and a pair of n-type MOS transistors, indicated $M_3$ and $M_4$. The "drains" of $M_1$ and $M_2$ are intended to be connected to the positive terminal of a direct-current voltage supply. The "gates" of these transistors are connected to each other and to the "drain" of $M_3$.

The "sources" of $M_1$ and $M_2$ are connected to the "drains" of $M_3$ and $M_4$ respectively. The "sources" of $M_3$ and $M_4$ are connected to the "drain" of a MOS phototransistor, indicated FM, which, conveniently, is formed in a small area $b_{ij}$ facing (through the support substrate 1) the area $a_{ij}$ on which the element ECM of electrochromic material is formed. The arrangement is such that light can fall on FM only through ECM and the support substrate 1. As a result, the intensity of the light falling on FM depends on the transparency of the associated ECM which, moreover, can be modified and, in particular, can be reduced or increased by the passage of current pulses through ECM in one direction or the other, as described above.

The weighting coefficient associated with FM can therefore be modified "on line" so that the neural net as a whole has a learning capacity.

Figure 4:
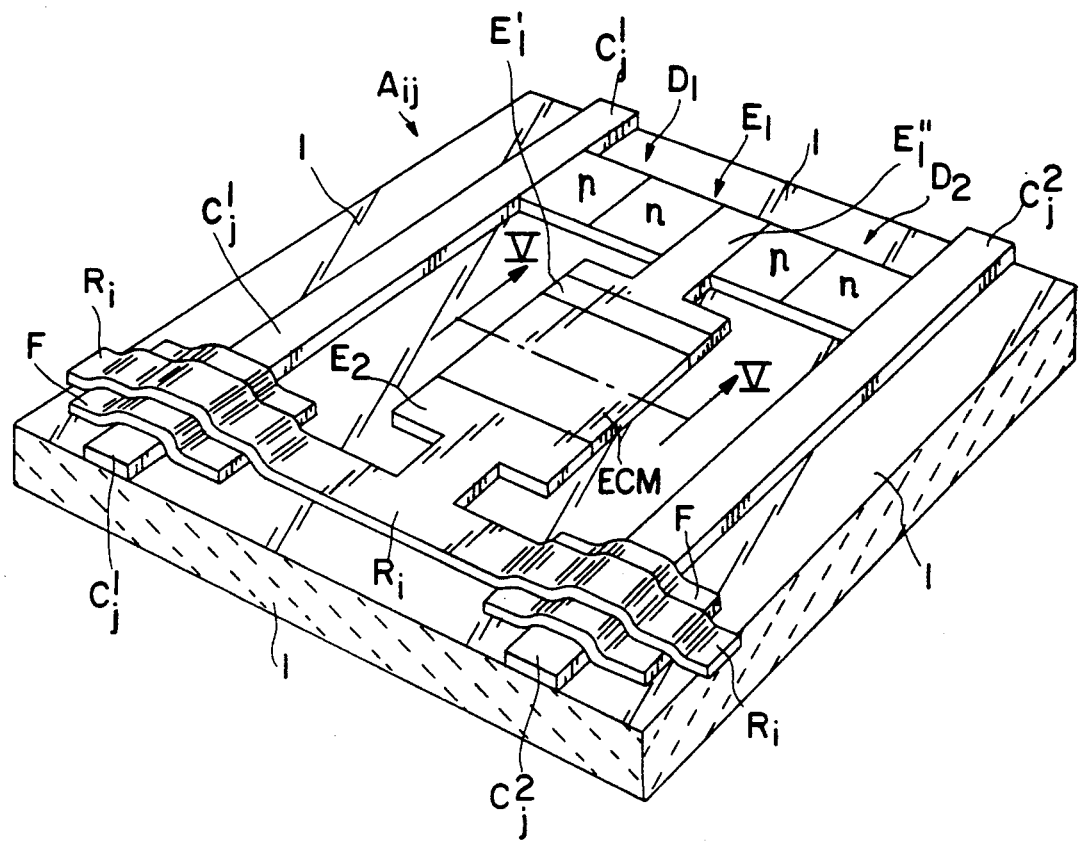
FIG. 4 is a perspective view of a portion of the matrix.
Figure 5:
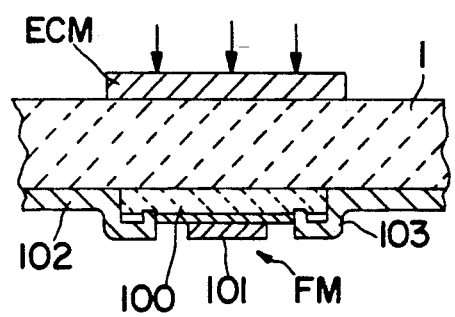
FIG. 5 is a partial sectional view taken on the line V-V of FIG. 4.

FIGS. 4 and 5 are qualitative illustrations of an embodiment of an individual connecting cell or region $A_{ij}$ of the matrix 2.

Conveniently, the column electrodes are made of metal, for example, gold, aluminium, tungsten, molybdenum, niobium, nickel (or even other metals) or alloys thereof. A line electrode $R_i$ with which the electrode $E_2$ of the electrochromic element ECM is formed integrally, is deposited on the column electrodes after the interposition of layers F of an insulating material constituted, for example, by $SiO_2$.

The electrode $E_1$ of the element ECM is formed in two parts:

a first part, indicated $E'_1$, formed by a mixture including a solid-state polymeric electrolyte, such as a polyethylene oxide, and an alkali metal salt, for example, $LiClO_4$ or $LiCF_3SO_3$, and a second part, indicated $E''_1$, constituted by an alkali metal such as lithium or sodium.

Still with reference to FIG. 4, the diodes $D_1$ and $D_2$ are formed by two p-n junctions, for example of silicon.

As can be seen from FIG. 5, the phototransistor FM of a synaptic circuit is formed on the lower face of the transparent support 1 in correspondence with the associated electrochromic element ECM. The phototransistor is formed, in known manner, by the deposition of a layer of amorphous silicon 100 suitably doped to form the drain, source and gate regions. The gate, drain and source terminals are indicated 101, 102 and 103 in FIG. 5.

Naturally, the principle of the invention remaining the same, the forms of embodiment and details of construction may be varied widely with respect to those described and illustrated purely by way of non-limiting example, without thereby departing from the scope of the present invention.

The foregoing description describes, with reference to the appended drawings, an embodiment in which the matrix 2 includes a plurality of pairs of column electrodes. As has been seen, this embodiment enables the transparency of individual electrochromic elements to be increased and reduced selectively in order to give the neural net a learning capability.

For applications in which there is expected to be a need or opportunity for the neural net to have a learning capacity such that, in operation, the transparency of the elements ECM always has to be modified in the same way, that is, always to increase their transparency or always to reduce their transparency, the matrix could be formed with single column electrodes and without the need for one-way conductive elements.

Finally, the definition of lines and columns in the foregoing description is of course purely conventional and does not presuppose the parallelism of the line electrodes or of the column electrodes or necesarily imply that the column electrodes are perpendicular to the line electrodes.

I claim:

1. A neural net for data processing capable of being adapted while on-line, said neural net comprising:
   a support substrate which is translucent;
   a plurality of pairs of column electrodes positioned on a first face of said support substrate and arranged substantially perpendicular to a first axis of said support substrate, each of said pairs of column electrodes comprising a first column electrode and a second column electrode; and a plurality of row electrodes positioned on the first face of said support substrate and arranged substantially perpendicular to a second axis of said support substrate;

wherein each of said row electrodes intersects at least one of said pairs of column electrodes, thereby forming a matrix element associated therewith; and wherein each of said matrix elements comprises:
- a phototransistor positioned on a second face of said support substrate;
- an element of electrochromic material comprising light transfer characteristics which change in response to an electrical impulse, said element of electrochromic material positioned on the first face of said support substrate and overlapping said phototransistor, a first contact of said electrochromic material connected to its associated row electrode;
- a first diode coupling a second contact of said electrochromic material to its associated first column electrode; and
- a second diode coupling the second contact of said electrochromic material to its associated second column electrode, the polarity of said second diode being opposite to that of said first diode in relation to said electrochromic material;

whereby, by supplying a current from a particular row electrode to a particular pair of column electrodes or from a particular pair of column electrodes to a particular row electrode, the matrix element associated with the intersection of the particular row electrode and the particular pair of column electrodes supplied with current is uniquely addressed and the light transfer characteristics of the electrochromic material thereof is electronically altered in one direction or in the opposite direction, respectively, and the resulting amount of incident light transferred by said electrochromic material to the phototransistor of the matrix element uniquely addressed is increased or decreased accordingly, thereby modifying impedance characteristics of the phototransistor in the desired fashion.

* * * * *